United States Patent [19]

Tossutto et al.

[11] Patent Number: 4,683,425
[45] Date of Patent: Jul. 28, 1987

[54] INTEGRATED CIRCUIT TEST CLIP

[75] Inventors: Jean F. Tossutto, Velizy; Hervé Bricaud, Plaisir, both of France

[73] Assignee: Socapex, Suresnes, France

[21] Appl. No.: 792,199

[22] Filed: Oct. 28, 1985

[30] Foreign Application Priority Data

Oct. 30, 1984 [FR] France ................................ 84 16596

[51] Int. Cl.⁴ ............................................ G01R 31/02
[52] U.S. Cl. ............................ 324/158 F; 324/73 PC
[58] Field of Search ............ 324/158 P, 158 F, 158 R, 324/73 PC, 133, 72.5; 339/17 CF, 17 C, 75 MP, 74 R, 75 R, 75 M

[56] References Cited

U.S. PATENT DOCUMENTS

| Re. 31,114 | 12/1982 | Berg ................................ 339/17 CF |
| B 404,290 | 1/1975 | Friend ................................ 339/75 M |
| 3,169,816 | 2/1965 | Hammond et al. .............. 324/158 F |
| 3,500,288 | 12/1969 | Startin et al. ......................... 339/128 |
| 3,989,331 | 11/1976 | Hanlon ........................... 339/17 CF |
| 4,112,363 | 9/1978 | Morrison et al. ................... 324/72.5 |
| 4,341,433 | 7/1982 | Cherian et al. ............... 339/176 MP |
| 4,463,310 | 7/1984 | Whitley ........................... 324/158 F |
| 4,498,720 | 2/1985 | Ichimura ....................... 339/75 MP |
| 4,553,805 | 11/1985 | Aikens ............................ 339/75 MP |
| 4,555,153 | 11/1985 | Bricaud et al. .................. 339/17 CF |

FOREIGN PATENT DOCUMENTS

| 0039568 | 11/1981 | European Pat. Off. ....... 339/75 MP |
| 2117844 | 10/1972 | Fed. Rep. of Germany . |
| 3218491 | 11/1983 | Fed. Rep. of Germany . |
| 2328199 | 5/1977 | France . |
| 1246101 | 9/1971 | United Kingdom . |
| 1384550 | 2/1975 | United Kingdom . |
| 0902125 | 2/1982 | U.S.S.R. ........................... 339/74 R |

OTHER PUBLICATIONS

"Pluggable, Solderless Component", by E. J. Webb, IBM Tech. Disc. Bull., vol. 7, #3, 8/1964, p. 244.

Primary Examiner—Reinhard J. Eisenzopf
Assistant Examiner—W. Burns
Attorney, Agent, or Firm—A. Jose Cortina; Roger H. Criss

[57] ABSTRACT

The present invention relates to a connection system between an integrated circuit, encapsulated in a "chip carrier with perimetric connections" or ceramic "MICOP", and the dynamic testing devices (for example between a microprocessor and a logic analyzer). This system of connection is a test chip which is formed of an insulating body comprising at its periphery a number of test contacts equal to the number of inputs-outputs of the MICOP installed or not in its connector. Locking levers pivotably mounted to the body provide locking of the test clip. Finally, a printed circuit fixed to the insulating body allows wiring of the connection cable to the test clip.

25 Claims, 26 Drawing Figures

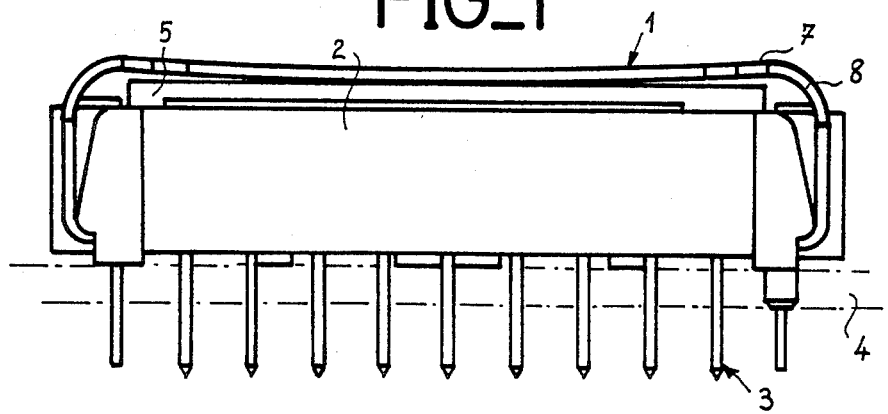
FIG_1
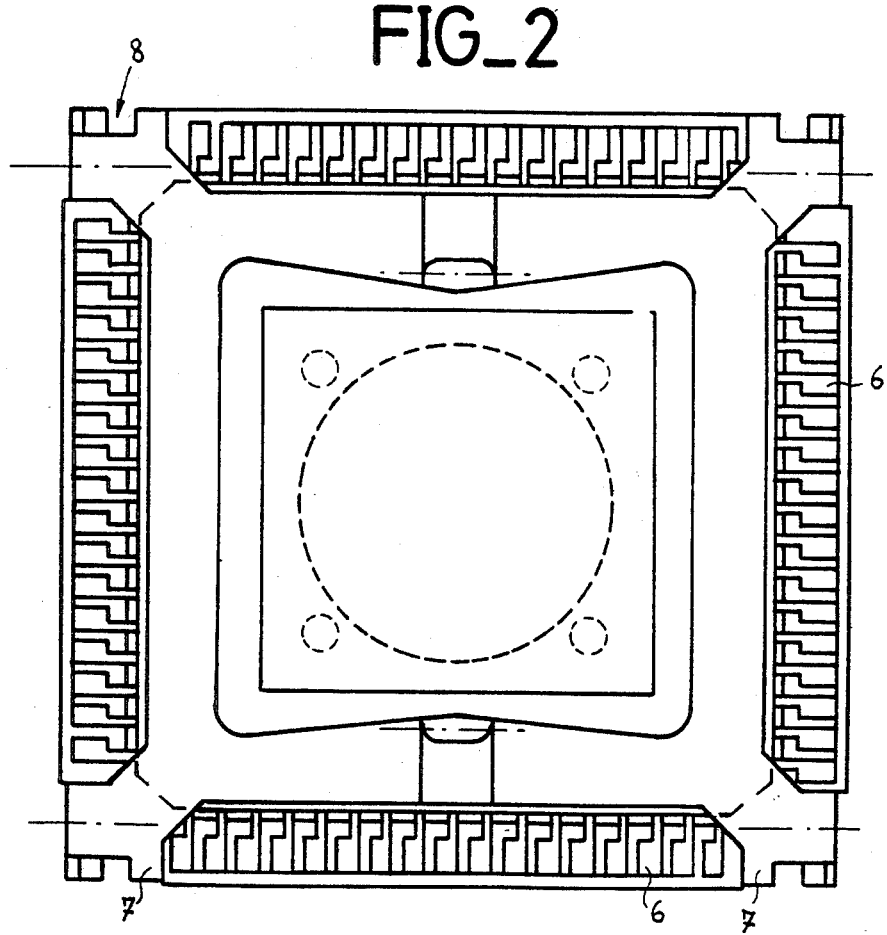
FIG_2

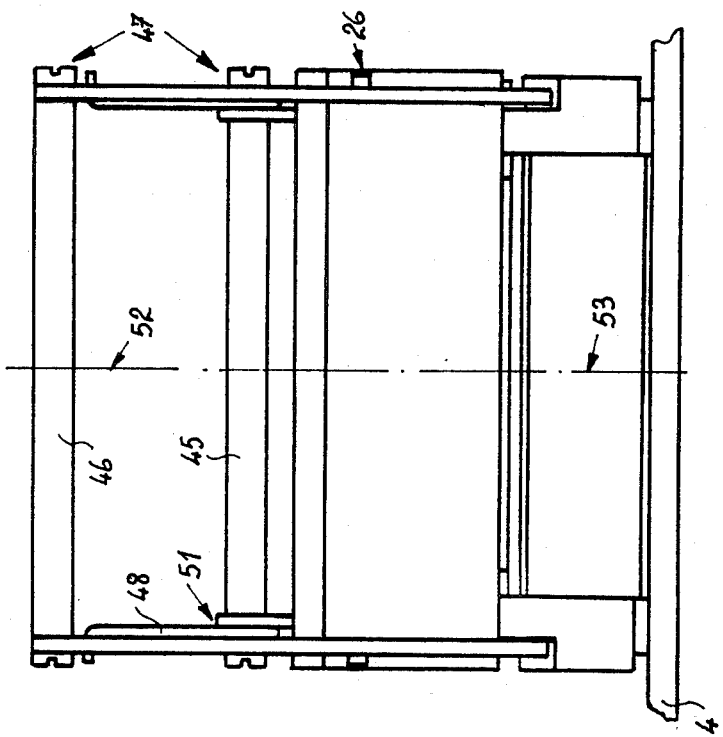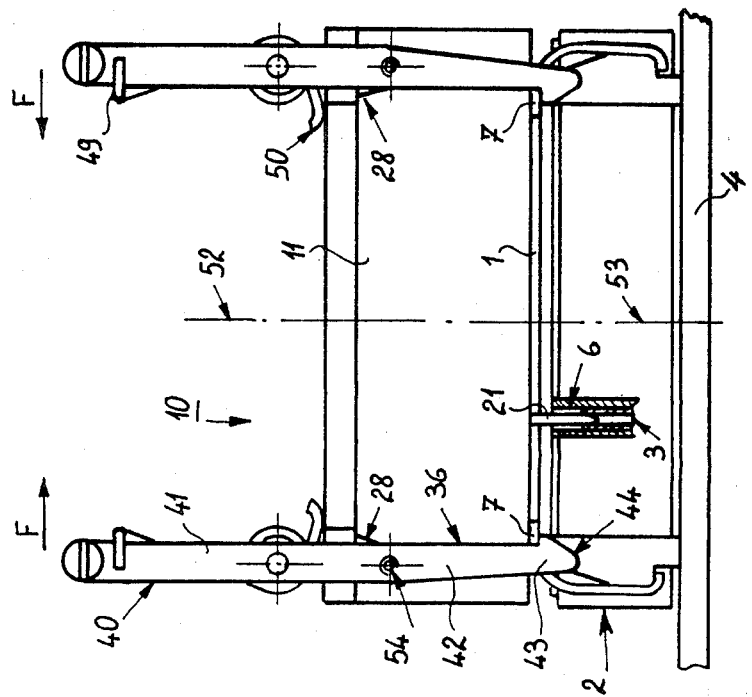

FIG_5
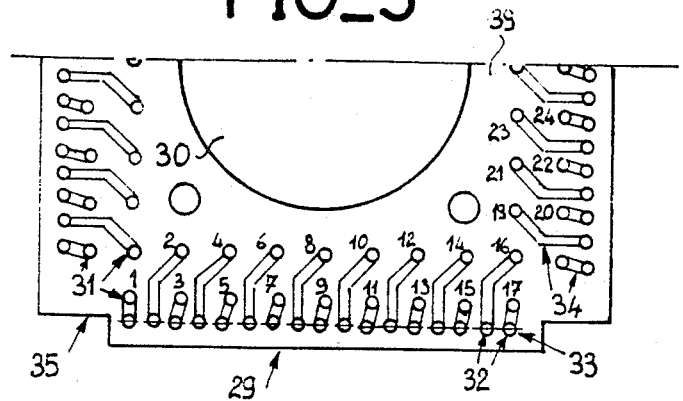
FIG_6
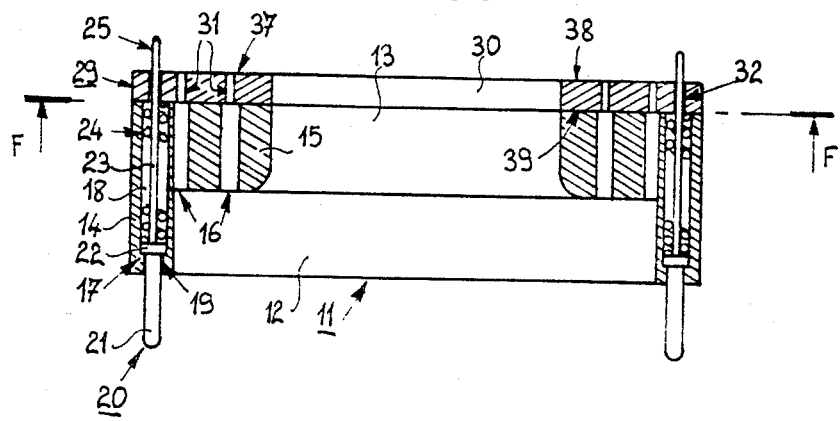
FIG_7
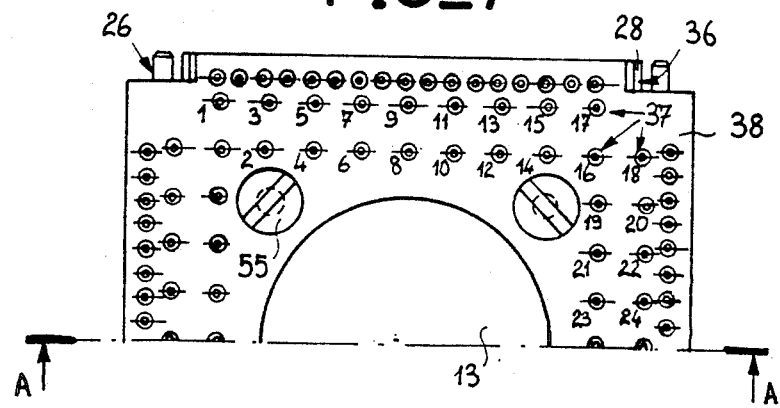

FIG_8
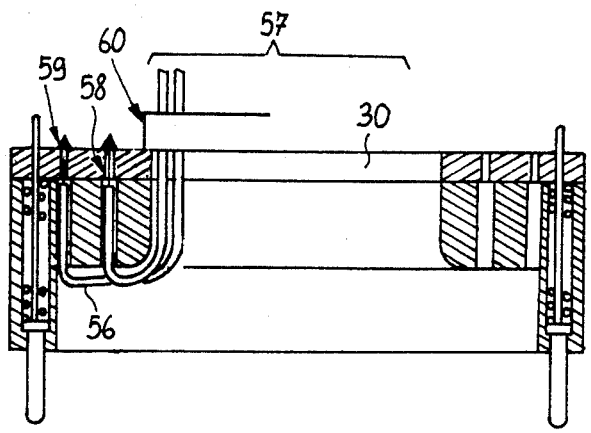
FIG_9
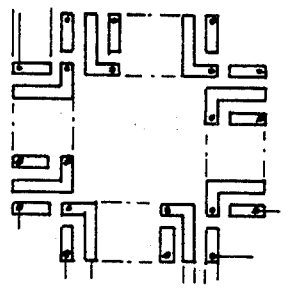
FIG_10
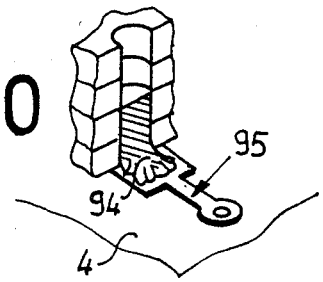

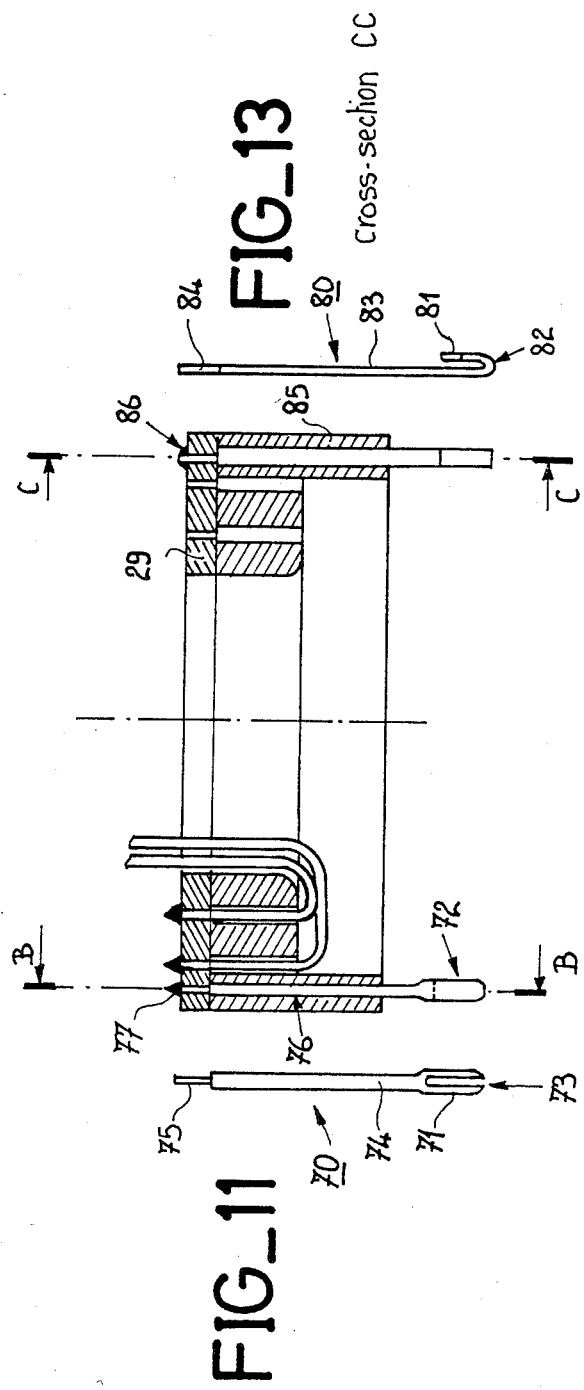

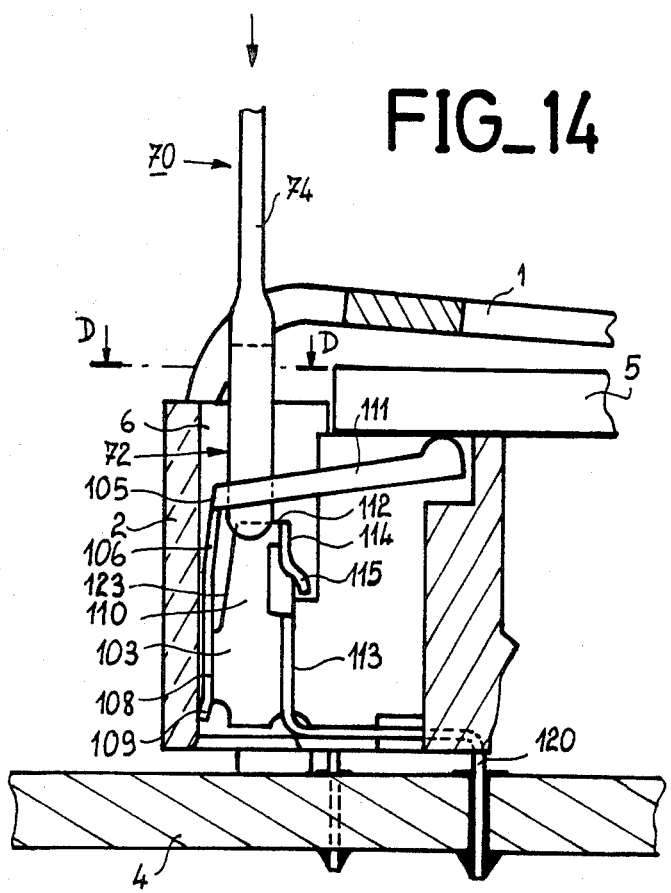
FIG_14
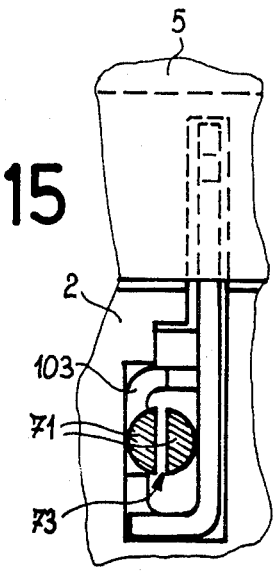
FIG_15

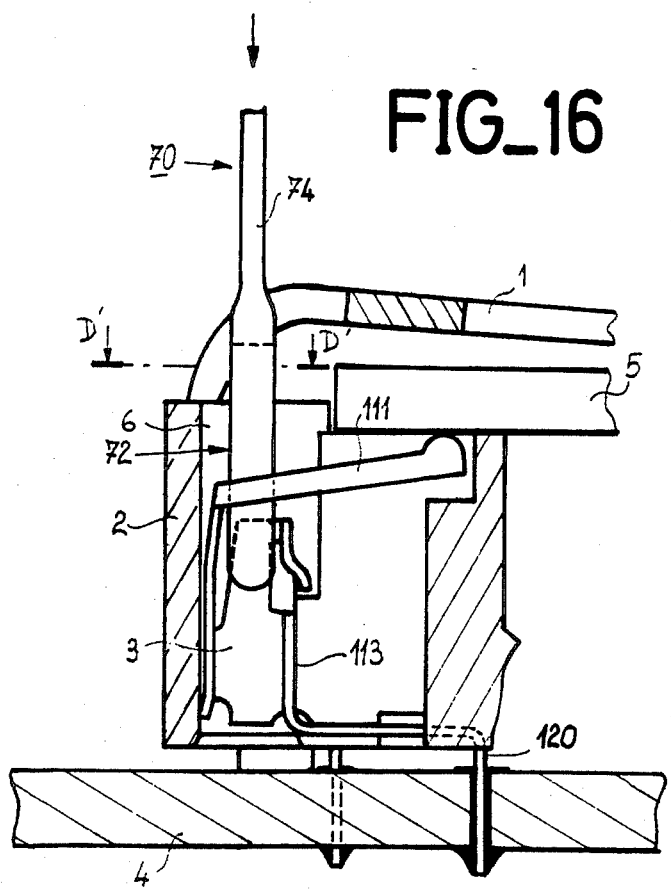
FIG_16
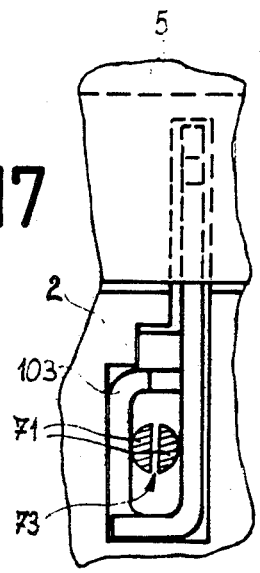
FIG_17

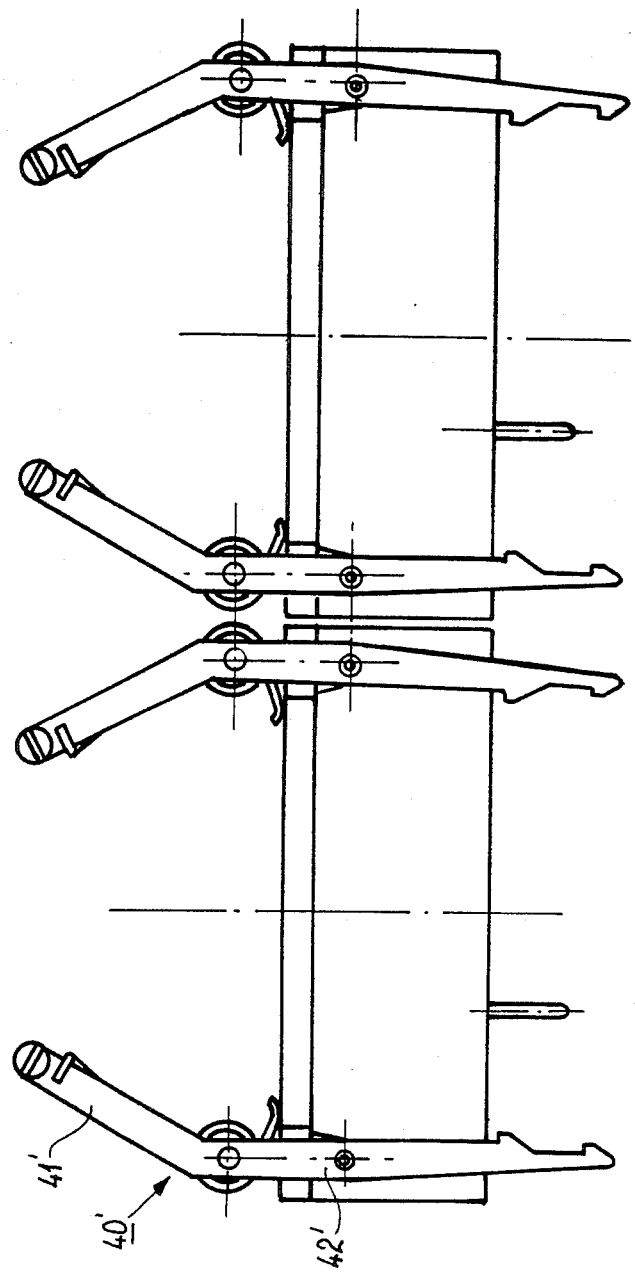

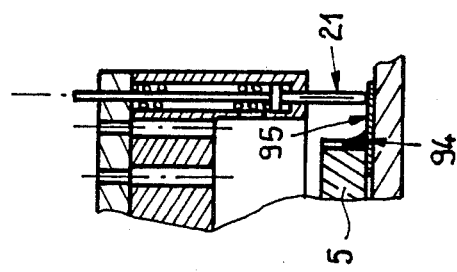
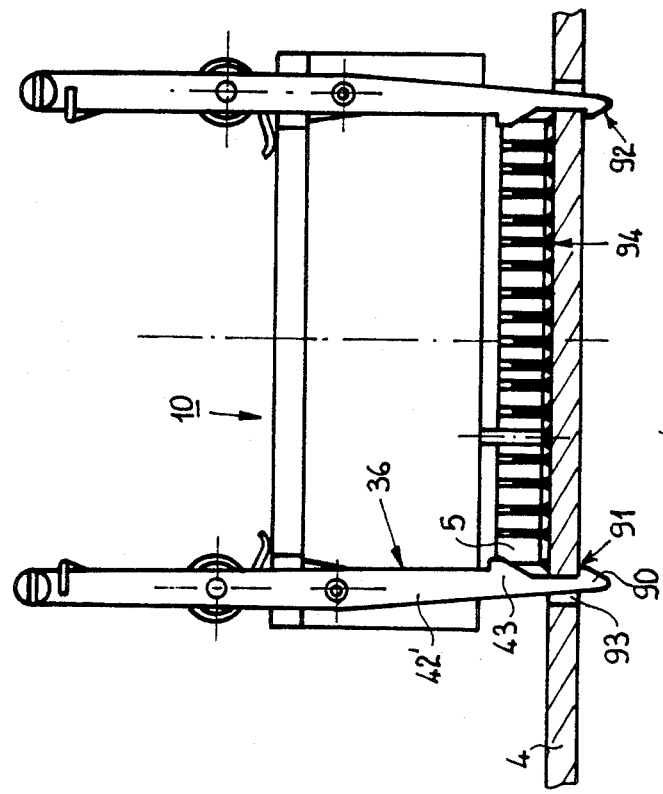

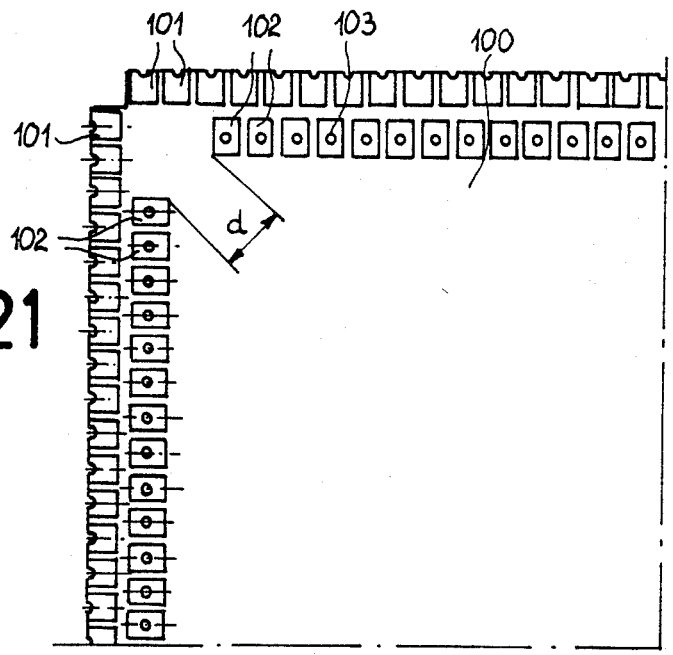
FIG_21
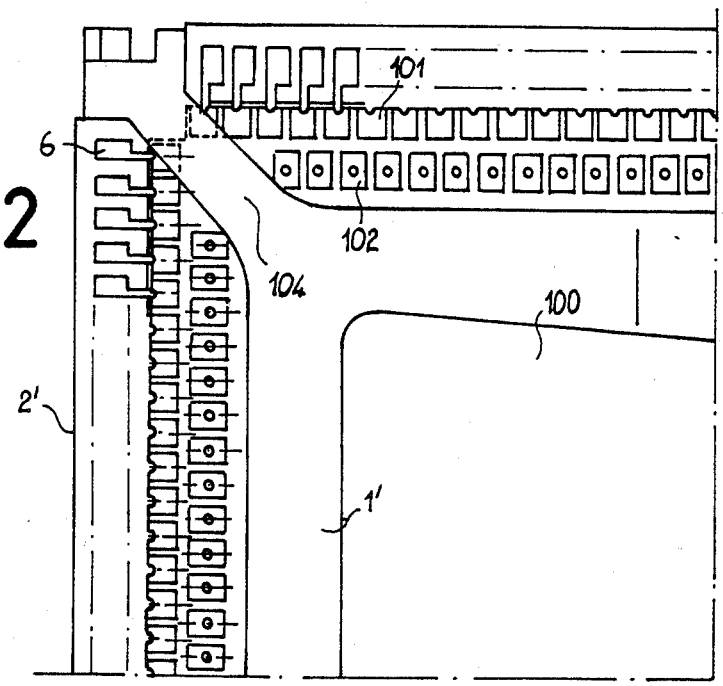
FIG_22

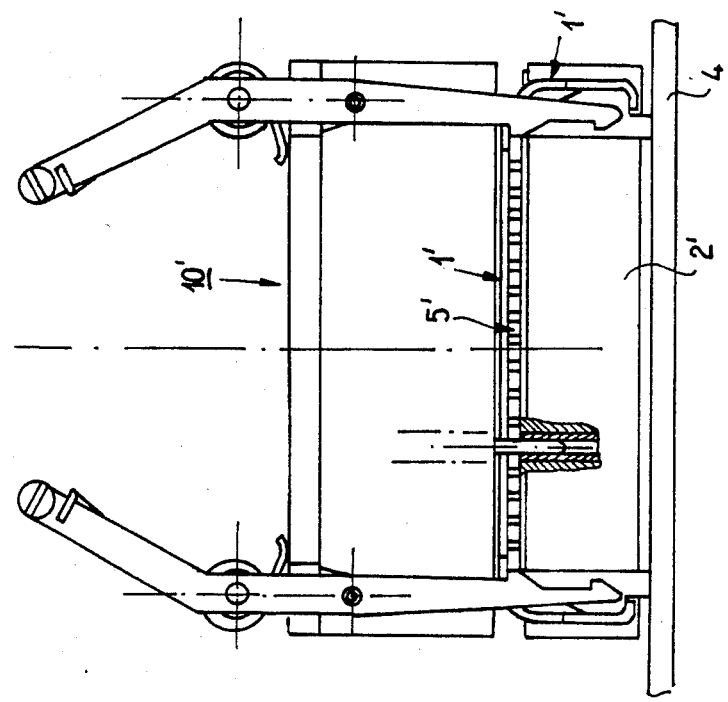

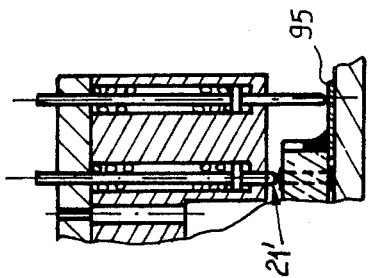
FIG_26
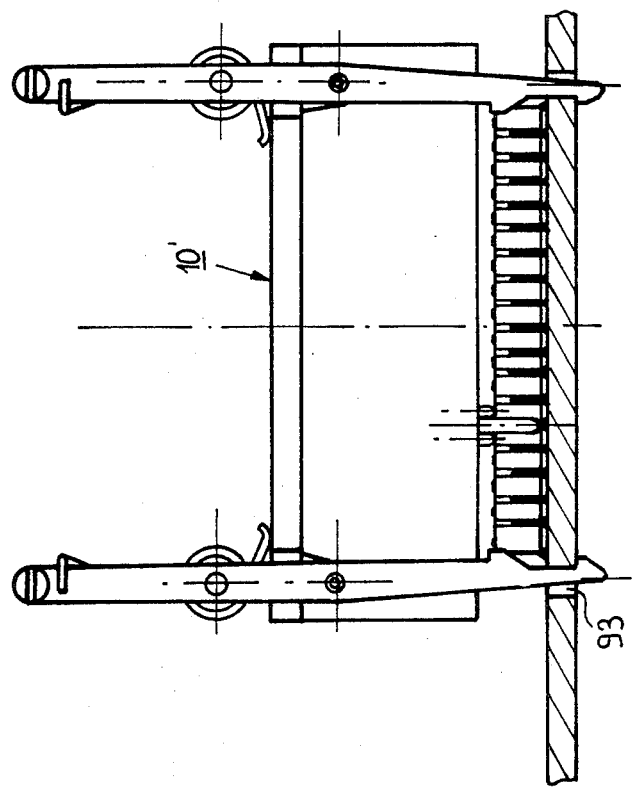
FIG_25

INTEGRATED CIRCUIT TEST CLIP

BACKGROUND OF THE INVENTION

The invention relates to an integrated circuit test clip.

1. Field of the Invention

The invention relates to a system for establishing connection between an integrated circuit, encapsulated in a microcase with perimetric connections or "chip carrier" or a ceramic "MICOP" mounted or not in a "MICOP" support connector, and dynamic testing devices (for example, between a microprocessor and a logic analyzer).

This system is indispensable for testing prototypes and during production of equipment comprising new generations of components such as the "MICOP", and it simplifies the after sales service and quality control.

2. Description of the Prior Art

The prior art is formed by entire test clips developed for DIL packages. These clips are connected directly to the protuberant zone of the output pins of the DIL package which are situated above:

the printed circuit when the DIL package is brazed to the board the support connector when the DIL package is mounted in such a connector.

The design of these types of test clips makes them unsuitable for testing MICOP packages placed or not in their support connector; in fact, the principle rests on that of the "clothes pin" each of the two jaws of which is equipped with a row of contacts which come to bear on the pins of the DIL package under the action of a clamping force exerted by the spring of the clip. This structure is not very readily applicable to a "MICOP" package with perimetric connections whether or not placed in a support connector also comprising connection pins on its four sides; and in any case, it would involve accessing the pins of the MICOP connector through the lateral sides, which is not always the possible.

These latter two remarks justify the choice for accessibility of the body of each of the contacts of the MICOP connector from the top so as to allow the dynamic testing of the MICOP in the connector using a new type of test clip whose originality and ease of use form the subject of the present invention. This accessibility is cited in the French patent applications:

No. 2 541 827 filed on the 25th of Feb. 1983 and entitled "Connector comprising at least one contact having an elastically deformable arm" in so far as the base is concerned:

No. 2 554 980 filed on the 10th of Nov. 1983 and entitled "Connector with zero insertion force for a rectangular circuit carrier and a closure clip for such a connector" in so far as the locking spring is concerned.

SUMMARY OF THE INVENTION

The invention provides an integrated circuit test clip comprising an insulating body which comprises a number of contacts intended to come into connecting relation with the inputs-outputs of the integrated circuit, two levers connected together by at least one cross piece, each lever having its lower part ending in at least one hook, each lever comprising an articulation so as to permit rotation with respect to an axis parallel to these cross pieces, said levers being mounted for pivoting on said body, a printed circuit fixed to said insulating body and a connecting cable which is connected to said printed circuit.

BRIEF DESCRIPTION OF THE DRAWINGS

The invention will be better understood from the following embodiments, given by way of non limitative examples, with reference to the Figures wherein:

FIGS. 1 and 2, are two views of a chip carrier showing perimetric connections in its connector;

FIGS. 3 and 4, are two views of the test clip of the invention;

FIGS. 5, 6 and 7, are three views of a part of the test clip of the invention;

FIG. 8, is a view of a part of the test clip of the invention, once connected with a connecting cable., FIG. 9 is a top view of the layout on the carrier board of a "MICOP" or of a "MICOP" connector;

FIG. 10, shows a brazing stud of the carrier board when a MICOP is brazed directly thereto;

FIGS. 11 to 17 show views of different parts of the test clip of the invention, this latter using sliding test contacts;

FIG. 18, shows a variant of the test clip of the invention;

FIGS. 19 and 20, are two views illustrating the use of the test clip of the invention with a MICOP brazed directly to a carrier board;

FIGS. 21 to 26 are views illustrating the use of a test clip and of a MICOP with a double row of input-output studs.

DETAILED DESCRIPTION OF THE PREFERRED EMBODIMENTS

FIGS. 1 and 2 show respectively a side view and a top view of a closed connector 2 on a chip carrier 5. This chip carrier 5 is positioned, without insertion force, so as to bear on the row of perimetric contacts 3 in the base 2 of the connector. The body, molded from a plastic material such as that of base 2, has a cavity whose internal contour exactly matches the external contour of the chip carrier 5. During positioning of chip carrier 5 in base 2, the respective fool-proof corners must be made to concord. (The lower bearing platform of the cavity of the base is not shown in the Figure). The connector is then closed by locking clip 1 on base 2. Such locking is achieved by exerting a pressure at the four corners of the locking clip 1. Under this pressure, the noses of the hooks of the clip slide over the guide slopes of the base until the noses snap into the corresponding flat housings of the base 2. During the locking operation, the bearing arms of the clip are resiliently deformed while exerting a thrust force on the chip carrier; and under the action of this thrust force, the chip carrier is pushed into the internal cavity of the base while resiliently deforming the contacts 3 of the base until the chip carrier abuts against the lower bearing platform of the cavity.

The form and structure of the locking plate 1 have been determined so that, after snap fitting, the thrust force exerted by the clip on the chip carrier is equal to or greater than the sum of the bearing forces of all the contacts 3 on the studs of the chip carrier.

Moreover, after locking, the clip allows access to the rear of the contacts for carrying out an electric test during operation if required. Finally, it has a sufficiently wide central opening to allow to pass therethrough, if desired, a heat sink fixed directly to the chip carrier and shown schematically by the contour lines.

In FIG. 2, the connector 2 comprises access passages 6 to the body of contacts 3 for testing during operation. The locking clip 1 comprises bearing studs 7 which provide a lever arm effect for the tool unlocking the contact.

In the rest of the description illustrated by the Figures, the test clip of the invention will be used without distinction either with an integrated circuit mounted in its connector or with an integrated circuit brazed directly to its carrier board.

The test clip 10 such as shown in FIGS. 3 to 7 is formed from an insulating body 11 comprising at its periphery a number of test contacts 20 equal to the number of inputs-outputs of the MICOP 5 installed in its connector 2. Locking levers 40 mounted for pivoting to body 11 lock the test clip 10 to the MICOP connector. Finally, a printed circuit 29 fixed to the insulating body 11 allows the connecting cable to be wired to the test clip 10.

The test clip 10 is positioned on the assembly formed by the MICOP package 5 such as shown in FIGS. 1 and 2 installed in its connector. The test contacts 20 come to bear on the accessible zone of the corresponding contacts 3 of the MICOP connector.

The sloping portions 44 of the lower arms 42 cooperate with the bearing studs 7 of the locking clip 1 of the connector for causing the levers 40 of the test clip 10 to pivot slightly which are then locked automatically by snap fitting on the stud 7 of the clip 1 when the relative position acquired by the test clip 10 on the connector is the one required for guaranteeing a good electric contact of the test contacts 20 with the contacts 3 of the MICOP connector.

The test clip 10 is centered on the connector, in the plane formed by the cross pieces 45 and 46, by the internal walls 8 of the clearances at the corners of the test clip 1 which guide the levers 40 of test clip 10 in this plane.

The combined actions of the slopes 44 of the four hooks 43 on studs 7 are balanced so as to provide self centering of the test clip 10 on the MICOP connector in the plane perpendicular to the axes of cross pieces 45 and 46. Final centering in this plane is obtained after snap fitting by the lower arms 42 coming to bear against the stop faces 36 of the body 11 of the test clip 10.

Thus, after snap fitting, the axes 52 and 53 of the test clip 10 and of the MICOP connector merge together.

The test clip 10 is held in the locked position on the MICOP connector by the action of springs 51 (centered on the cross pieces 45 of levers 40) which, under the effect of their pressure arms 50 at the top of the test clip 10, transmit to levers 40 by their lever arm 48 a rotation torque about their pivot point 26, thus preventing any accidental unlocking of the test clip and allowing the operator to release this latter and carry out all the desired tests in all safety.

The surface of test clip 10 projected on the carrier board 4 will be preferably equal to or slightly less than that of the MICOP connector so as to allow simultaneous testing, using several test clips, of several MICOPs installed in connectors mounted in contact with each other on all sides.

For unlocking the test clip 10 from the MICOP connector, it is sufficient using two fingers of the hand to press the two cross pieces 46 in the direction of arrows F shown in FIG. 3. The rotation thus undergone by levers 40 releases hooks 43 which are disengaged from stud 7. Under the action of the "pump" test contacts 20 which relax while exerting a vertically upwardly directed force, the test clip 10 is then raised and may be readily withdrawn from the MICOP connector. The slopes 28 of the insulating body 11 allow, through corresponding clearances, rotation of the arms of lever 40 and limit this rotation so as to prevent the lower arms 42 from leaving the volume formed by the planes of the external lateral walls of the MICOP connector base 2 and do not strike the test clips or the MICOP connectors which may be possibly mounted in contact with the former. Preferably, the external edge of the lower arm 42 has a slope with a value substantially equal to that of slope 28 so as to prevent the end of arm 42 from leaving the above mentioned volume. This is particularly interesting when arm 42 is extended so as to allow other uses of the test clip 10.

In FIG. 3, the levers 40 are positioned, in housings in body 11, slightly set back from the outer contour of the test clip 10.

For different sizes of integrated circuits, the test clip of the invention keeps the same form, only the body 11 and the integrated circuit have their sizes adapted to those of the MICOP as well as the cross pieces used in the different cases which have different lengths; in fact, the heights of the connectors are constant.

The "pump" test contact 20 illustrated in FIG. 6, made from an electrically conducting material, comprises:

a contact finger 21 which cooperates with the corresponding contact 3 of the MICOP connector to be tested;

a support rod 23 of a diameter less than that of finger 21;

a collar 22 of diameter greater than that of finger 21 and situated between this latter and the support rod 23;

a helical pressure spring 24, fitted over the support rod 23, which provides the bearing force of the test contact 20 on contact 3 of the MICOP connector, which is necessary for guaranteeing a stable electric contact between these two elements.

The housing for each test contact 20 is formed by:

a guide hole 19, in the lateral wall 14 of the insulating body 11, in which the contact member 21 slides;

a recess 18, of a section greater than that of hole 19, which contains the pressure spring 24 and the support rod 23., a retaining face 17, formed by changing the section between hole 19 and recess 18, on which the collar 22 of the test contact 20 comes to bear in the rest position.

The housing is closed at its upper part by the printed circuit 29 whose corresponding metallized hole 32, of a diameter less than that of the pressure spring 24, allows the upper end of the support rod 23 to pass therethrough and guides it when the test contact 20 slides in its housing. The upper end of the compression spring 24 bears on the cap 33 of the metallized guide hole 32. The heights of recess 18 and of spring 24 in the free condition are determined so as to produce the desired bearing force when the test clip 10 is locked on the MICOP connector; by way of example, we have chosen in our application the following heights: 7 mm for recess 18 and 9 mm for the spring in the free condition.

The electrical connection between the contact finger 21 and the corresponding metallized hole is provided by:

the electrical conducting pressure spring 24 whose:

lower end is applied against collar 22 and the turns are in contact with the support rod 23 over the whole length thereof, upper end bears against cap 33 of the metallized hole 32 of the printed circuit 29, the conducting track 34 serving as connection between cap 33 of the metallized hole 32 and the metallized hole 31 serving for brazing the corresponding wire of the external connection cable.

There also exists a direct electrical connection between the test contact 20 and the metallized hole 32 through the end 25 of the support rod 23 which rubs against the internal wall of the metallized hole 32 when passing therethrough. But the quality of this electric contact, which is added to the one described above, is not guaranteed for no controlled application force is exerted between the end of the support rod and the metallized hole 32, as in the preceding case, through spring 24.

During positioning of the test clip 10 on the MICOP connector, finger 21 of the test contact 20 penetrates in a first stage into the upper part 6 of the recess of the MICOP connector, thus providing preguiding of the contact finger towards the rear part of the contact 3, i.e. the upper part of the U shaped body of this latter described in patent application no. 2 541 827 which will be considered subsequently in connection with FIG. 14.

When test clip 10 is locked on the MICOP connector as shown in FIG. 3, each "pump" test contact 20 bears on the corresponding contacts 3 thus establishing an electric connection, through this latter, between the input-output stud of the MICOP (which may be operating) and the corresponding wire of the connection cable connected to the dynamic test device.

The pressure springs 24 absorb the slight differences in height of contacts 3 of the connector due to manufacturing tolerances. The characteristics of these springs are such that the small differences of height of contacts 3 cause negligible bearing force variations between each of them and without effect on the electric contact resistance values.

Furthermore, the bearing force of the test contact 20 is exerted on the upper part of the U shaped body of contact 3, i.e. on a rigid part thereof: there is therefore no risk of disturbance of the electric contact between contacts 3 of the connector and the corresponding stud of the MICOP, as would have been the case if the test contact 20 had been applied against the resilient part of contact 3.

The insulating walls of housing 6 avoid any risk of short circuit between two adjacent contacts 3 through the test contact 20 due to wrong positioning of the test clip 10 or an unfortunate approach thereof, or else due to a test clip having a deformed test contact 20.

It will be noted that locking clip 1, forming the subject matter of patent application no. 2 554 980, was designed so that its outer contour completely frees the whole of the entrances 6 of the recesses thus allowing direct access (from the top) to the contacts 3 of the connector by the test contacts 20 of the test clip 10.

The printed circuit 29 is fixed to the base 15 of the insulating body 11 of the test clip by means of screws 55 in our example: thus, it holds the test contacts 20 and their springs 24 imprisoned in their housings. The test clip 10 may be delivered in this form to the user who, depending on his needs, will opt for the mode of connection of his choice with the connection cable of the test device.

Several possibilities may be envisaged for connecting the test clip 10 to the connecting cable 57, for example:

contacts force fitted into circuit 29 for forming a disconnectable plug;

self stripping forks force fitted into circuit 29 for connecting a cable harness;

"relay" forks inserted in the circuit for brazing the wires of cable 57;

direct brazing of the wires of the connecting cable to the circuit 29.

It is this latter solution which has been shown by way of example of the invention in FIG. 8.

The strand of the connecting cable 57 is introduced into the test clip through opening 30 in circuit 29 extended by the hole 13 through which the insulating body 11 passes. The end of the wire strand is then opened out inside the internal housing 12 so as to direct each wire 56 to the wire guide hole 16 which corresponds to it. The identification of these latter is facilitated for example by the fact that their lay out is identical to that of the output terminals of the contacts 3 of the MICOP connector on the carrier board 4, shown in FIG. 9. It then becomes very easy to make a correlation between the wire guide hole 16 and the number of the output stud of the MICOP to which the wire 56 is assigned. The wire guide 16 facilitates the insertion of the stripped end 58 of wire 56 into the metallized hole 31. Wire 56 is pushed into the wire guide until the sheath comes into abutment against the inner face 39 of circuit 29. The stripped end 58 which then passes through circuit 29 is brazed in the metallized hole 31 to the cap 37 of the outer face 38 of circuit 29.

When the whole of wires 36 have been brazed to circuit 29, the strand is tightened outwardly of the test clip and locked in the position by means of the cable clamp 60 for example. This latter holds wires 56 in the housing 12 of the insulating body 11. The connection thus obtained is reliable and very clean.

The studs 25 of test contacts 20 which project from circuit 29 may be used if required for an individual test tapping using a "wire grip" for example. This individual test tapping may be carried out concurrently with the overall test effected by the dynamic test device via the connecting cable.

A different technical solution for the "pump" system may be chosen for the contact of the test clip 10: it is a question of the sliding contact two versions of which are shown by way of example in FIGS. 11 to 17.

Contrary to the "pump" test contact 20 which is of the zero insertion force type (Z.E.I.F), the sliding test contact must be plugged into housing 6 of contact 3 of the MICOP connector and provide electric contact therewith through a lateral pressure exerted on a part of this contact 3 by clamping of the resiliently deformable head of the test contact.

This technical solution is particularly well adapted to the "MICOP" connector comprising contacts having a resiliently deformable arm "forming the subject of French patent no. 2 541 827. In fact, the input of housing 6 containing the contact 3 which has a U shaped body and a resilient arm forms the receptacle of the head of the sliding test contact of the test clip 10. In this French patent no. 2 541 827, the electrical contact, as shown in FIG. 14, comprises a U shaped body 103 whose longitudinal axis is shown conventionally as vertical and having a bottom 110 and two wings, the first one referenced 108 being in a single block whereas the second comprises a lower part 113 and an upper part 114 situated in tte same plane ard separated by a resilient retention tongue 115. The second wing has at the end of its lower part 113 an output terminal 120.

The upper part 114 of the second wing is connected to the upper part of bottom 110 by a bending zone. The upper part 114 is extended downwardly by the resilient tongue 115. The resilient tongue 115 has a resilient spring region forming the lower extension of the upper part 114 of the second wing, a slanted arm forming a dihedron of about 150° with the resilient region and a foot directed approximately in the vertical direction and which provides locking properly speaking of the tongue. Between tongue 115 and bottom 110 there exists a slit.

Wing 108 is extended in its upper part by a vertical spring arm 106. At its lower part, it is connected to a pressure tongue 109 by a bending zone so that tongue 109 extends outwardly of wing 108.

The lateral flange of spring 106 situated opposite the bottom of the U 110 has at its upper end a bending zone 105 about which is bent a lever 111 whose axis is slanted with respect to the horizontal (for example of the order of 18°) so that its end forming a crook is situated above the upper part 112 of the body 110 of the contact. The spring arm 106 is separated from body 110 by a slit bordered on one side by an edge of the spring arm 106 and on the other by the edge 123 of the body of contact 110. Lever 111 receives the vertical application force of the substrate during insertion thereof but remains relatively rigid since this force is directed along the upper lateral face of lever 111. Furthermore, since the force has a vertical axis, i.e. along the axis of the spring arm 106, this latter is not subjected to a cutting force but only to a bending moment, in other words the spring arm 106 operates practically by pure flexing the longitudinal compression forces being negligible. In this case, the ideal form is an arm of equal width and equal thickness which allows a spring arm 106 of optimum shape to be obtained by simple stamping from the U shaped wing 108.

One of the legs (or blade) of the head deformable by nipping of the test contact comes to bear against the wall of housing 6 and the second leg (or blade), through resilient deformation, comes to bear laterally on the arm of contact 3 establishing the electric contact therewith, as shown in FIG. 15. Since the bearing force is exerted laterally on the arm of contact 3, there is no risk of disturbing the electric contact between contacts 3 of the connector and the corresponding stud of the MICOP.

FIGS. 16 and 17 show a variant of the technical solution presented in the preceding paragraph: the deformable head of the sliding contact is finer so as to penetrate inside the cage formed by the U shaped body and the deformable arm of contact 3. The advantage of this variant is that two electric contact points are established: one on the U shaped body, the other on the arm of contact 3.

The test contact 70 of FIG. 11 which is considered by way of example in FIGS. 14, 15, 16 and 17 is formed from split heads 72 whose two flexible branches 71 separated by the slit 73 form a lyre and may be elastically deformed by nipping during insertion thereof into the housing 6 of contact 3 of the MICOP connector. The split head 72 is integral with a rod 74 housed in the housing 76 of the insulating body 11 of the test clip 10. Rod 74 is extended at its upper end by a pin 75 whose insertion and brazing 77 in the metallized hole 32 of the printed circuit 29 ensure both mechanical fixing of the test contacts 70 in the test clip 10 and the electric interconnection with the connecting cable 57 via tracks 34.

The test contact 80 of FIG. 14 is formed from a blade 83 whose lower end ends in a curved branch 81 and forms the "cantilever" head 82 of the test contact 80. ranch 81 may be resiliently deformed by nipping during insertion thereof into the housing 6 of the contact 3 of the MICOP connector. Blade 83., housed in its housing 85 in the insulating body 11, is extended at its upper end by a pin 84 providing mechanical fixing 86 and electrical interconnection of the test contact 80 with test clip 10.

In a variant of the invention shown in FIG. 18, the upper arm 41' of the locking lever 40' forms an angle of about 150° with the lower arm 42'. This form increases the distance separating the cross pieces 46 of two test clips used simultaneously on two MICOP connectors mounted in contact with each other. That facilitates the locking and unlocking operations of a test clip in the presence of another adjacent one.

The test clip 10, in its "pump" test contact version, may also be used for the dynamic testing of a MICOP directly transferred to the carrier board. In fact, the transfer studs 95 of the carrier board 4 (see FIGS. 19 and 20) project beyond the contour of the MICOP by approximately 1 to 2 mm. This transfer stud allows the formation of the brazing bead 94 on the edge of the MICOP, the remaining part of stud 95 is generally used for testing, repairs or modifications of the board.

Since this stud 95 is in the axis of housing 6 of contact 3 of the connector (when this latter is placed between the MICOP and the carrier board) it is then possible to use the same test clip 10 in the two configurations contemplated, MICOP mounted in its connector (configuration described above);

MICOP brazed directly to the carrier board.

In this second case, the "pump" test contacts 10 come to bear on the transfer stud 95 (see FIG. 10) of the carrier board 4. The test clip 10 is held on this latter during the whole of the dynamic testing for example, by means of small hooks 90 which snap into four holes 93 pierced in the carrier board 4 at the four corners of the MICOP.

The hooks 90 are situated at the end of the lower arms 42' of the locking levers which have therefore been modified for this use. This modification consists in extending the lower arms 42, previously described, so as to add thereto small additional hooks 90. Arm 42' keeps the hook 43, although useless when the test clip is used with a MICOP transferred directly to the carrier board, for this latter may thus be used equally with or without MICOP connector for the dynamic testing of the MICOP.

Hooks 90 are provided with a snap fit slope 92 for facilitating insertion thereof in the holes 93 of the carrier board 4.

It will be noted that edge 91 of the small hook 90 is preferably in the extension of the edge of the lower arm 42' which comes to bear on the stop face 36 of the insulating body 11. Thus, hook 90 has no action on the studs 7 of clip 1 during locking of the test clip 10 on a MICOP connector. After locking, hooks 90 are disengaged inside clearances in base 2.

A new generation of chip carriers is being developed for reducing the space required when the number of input-output studs becomes too high: greater than 100 for example (see FIG. 21).

These chip carriers 100 are distinguished from conventional chip carriers by the fact that they have two rows of alternating studs on the four sides and on two faces. The outer row of studs 101 is similar to that of conventional chip carriers.

Each stud 102 of the internal row has a metallized hole 103 which provides the electric connection with the corresponding stud of the face and allows the rise and control of the brazing of the lower stud when the chip carrier is brazed directly to the carrier board. From this characteristic comes the name generally attributed to these carriers: "open-via-chip-carrier" or "O.V.C.C.".

It should be noted that in each corner of the O.V.C.C. the endmost studs of two adjacent internal rows 102 define therebetween a free space of distance "d", considerably greater than the one existing at the level of the endmost studs of the internal rows 101. That is explained by the need to pass therethrough inter connections of the studs towards the central cavity of the chip carriers receiving the semiconductor wafer.

Thus, it can be seen in FIG. 22 that when the O.V.C.C. is mounted in the base 2' of its connector, the fastening 104 for the attachements of the locking clip 1' of this latter uncovers the whole of the studs 102 of the internal rows. Which is obviously not the case for the endmost studs of the external rows 101 since two studs 101 at least are covered at each corner of the chip carrier by clip 1'.

Combining the characteristics of the invention presented above (for the dynamic testing of a conventional chip carrier mounted in its connector or brazed directly to the carrier board), it is therefore possible to provide a test clip 10' equipped at its periphery with "pump" test contacts over two alternating rows (see FIGS. 23 and 24):

the external test contacts corresponding to the studs of the external row of the O.V.C.C. work in the external housings 6 of the base of the connector (these test contacts are identical to those previously described);

the internal test contacts corresponding to the studs of the internal row of the O.V.C.C. bear directly on studs 102 of the internal rows of the upper face of the O.V.C.C. since they are all accessible (which is not the case moreover for contacts 3 and the associated housings of the connector corresponding to studs 102 of the O.V.C.C.). To compensate for the difference of level of the bearing points of these test contacts with respect to those of the external row, the contact finger 21' of the test contacts of the internal row are shortened.

The system for positioning the test clip 10' on the connector of the O.V.C.C. is identical to that described above.

Wiring of the connecting cable to the test clip 10' follows the same procedure as that described above but the metal holes 31' for brazing the wires of the connecting cable to the printed circuit 29' are in this case for example disposed in two alternating rows having the same "pitch" as the metalized holes 32' for guiding the "pump" test contacts or in four alternating rows with a "pitch" twice that of these latter.

Electric connections provide the interconnection between the metallized guide holes 32' with those of the corresponding row of the metallized brazed holes 31'.

FIGS. 25 and 26 show the test clip 10' used for the dynamic testing of an O.V.C.C. brazed directly to the carrier board. In this case, the lower arms 42' of the locking levers must necessarily be provided with small hooks 90 for snap fitting into the holes 93 in the carrier board. The test clip 10' may then be used equally for the dynamic testing of an O.V.C.C. with or without intermediate connector.

What is claimed is:

1. An integrated circuit-testing combination of a printed circuit and a test clip, comprising an insulating body having a predetermined number of test clip contacts constructed for establishing electrical connection with inputs-outputs of integrated circuits in a vertical direction, at least two levers oppositely disposed with respect to said insulating body and connected together by at least one cross-piece, each lever having a lower part which ends in at least one hook for hooking onto means for carrying at least one of said integrated circuits, each lever comprising an articulation for permitting rotation with respect to an axis parallel to said cross-pieces and mounted in a manner for pivoting on said body whereby each of said at least one hook can be moved for hooking onto said means for carrying at least one of said integrated circuit, a printed circuit fixed onto said insulating body and having plural conductive circuit paths, each one in electrical contact with a respective one of said predetermined number of test clip contacts, and a connecting cable having plural conductors, each for establishing electrical contact into a respective one of said predetermined number of contacts.

2. The test clip as claimed in claim 1 wherein the levers of each clip are connected together by two cross pieces, a spring corresponding to each lever is centered on one of these cross pieces so as to transmit to said levers, by pressure on the top of the test clip, a rotational torque about their articulation and so as to prevent any disengagement of said test clip.

3. The test clip as claimed in claim 1, wherein said insulating body comprises inclined bearing surfaces for limiting the rotation of said levers.

4. The test clip as claimed in claim 1 wherein said integrated circuit is mounted in a connector having contact zones for establishing electrical connection with said integrated circuit, and wherein the test clip contacts are shaped and positioned for coming into connection in a vertical direction on the contact zones of said connector.

5. The test clip as claimed in claim 4, wherein, with said integrated circuit locked in said connector by means of a locking clip which comprises studs, each lever comprises a lower arm having a locking slope which cooperates with the studs on which the locking clip of the connector bears.

6. The test clip as claimed in claim 1, wherein said test clip contacts comprise "pump" test contacts with comprise a helical spring in the vertical direction for establishing said electrical connection with inputs-outputs of said integrated circuits.

7. The test clip as claimed in claim 6, wherein each "pump" test contact is made from an electrically conducting material comprising:
   a contact finger;
   a support rod of a diameter less than that of the finger;
   a collar of a diameter greater than that of said finger situated between this latter and said support rod;
   a helical pressure spring fitted over the support rod, which provides the bearing force of the test contact required for guaranteeing a stable electrical contact; and wherein each test contact is disposed in a housing formed by:

a guide hole in the lateral wall of the insulating body, in which said contact finger slides;

a recess, having a section greater than that of said hole, which contains said pressure spring and said support rod;

a retaining face, formed by the change of section between said guide hole and said recess, on which the collar of the test contact comes to bear as urged by said helical pressure spring for being in a rest position.

8. The test clip as claimed in claim 7, wherein each housing is closed at its upper part by a cap defined by the printed circuit having a corresponding metallized hole, of a diameter less than an of said pressure spring, allows that upper end of said support rod to pass therethrough and guides it when the test contact slides in its housing, the upper end of said pressure spring coming to bear on the cap of said metallized guide hole.

9. The test clip as claimed in claim 7, wherein each pressure spring is made from an electrically conducting material, and has its lower end applied against said collar and the spring having turns in contact with the support rod over the whole length thereof and its upper end is applied against a cap defined by the printed circuit of said metallized hole of the printed circuit so as to provide an electric connection between said contact finger and the corresponding metallized hole.

10. The test clip as claimed in claim 1, wherein the test clip contacts are force fitted into connection with the printed circuit for forming a disconnectable plug.

11. The test clip as claimed in claim 1, wherein the test clip contacts are self stripping forks force fitted into connection with the printed circuit for connecting a wiring harness thereto.

12. The test clip as claimed in claim 1, wherein the test clip contacts are "relay" forks inserted into the printed circuit for brazing wire conductors of the cable thereto.

13. The test clip as claimed in claim 1, wherein direct brazing of wire conductors of the connecting cable to the printed circuit is provided.

14. The test clip as claimed in claim 1, wherein said printed circuit comprises an opening, said insulating body comprising a passage hole which coextends with this opening and wherein wire conductors of the connecting cable passes through said opening in the circuit extended by said passage hole, an end of each wire conductor being opened out inside an internal housing of said insulating body, each wire conductor passing through a wire guide hole and its opened and penetrating into a metallized hole of the printed circuit, said opened end of each wire conductor having a sheath in abutment against an inner face of the printed circuit and being brazed in the metallized hole to a cap on an outer face of said printed circuit.

15. The test clip as claimed in claim 4, wherein the test clip contacts comprise at least one sliding test contact.

16. The test clip as claimed in claim 15, wherein said connector having said integrated circuit mounted therein comprises a housing wherein is located each contact zone, which are in turn in conact with the integrated circuit and each sliding test contact must be plugged into the housing of the connector and provides the connection with the contact zones through a lateral pressure exerted on a part of said contact with the integrated circuit by clamping of a resiliently deformable head of the sliding test contact.

17. The test clip as claimed in claim 15, wherein said connector comprises contacts having a resiliently deformable arm, the connector including an input of a housing containing the contacts which have a U shaped body and a respective elastic arm forming a respective receptacle for a head of the respective sliding test contacts of the test clip.

18. The test clip as claimed in claim 15, wherein said sliding test contact is formed from a split head having two flexible branches separated by a slit to form a lyre, and constructed for being resiliently deformed by nipping during insertion thereof.

19. The test clip as claimed in claim 18, wherein said split heasd is integral with a rod housed in a housing of the insulating body of the test clip, said rod is extended at its upper end by a pin inserted and brazed in the metallized hole of the printed circuit to provide both mechanical fixing of said test contact in the test clip and electrical interconnection with the connection cable through conductive paths.

20. The test clip as claimed in claim 15, wherein said sliding test contact is formed from a blade having a lower end ending in a curved branch constructed for being resiliently deformed by nipping during insertion thereof, said blade being housed in a housing in the insulating body and extended at its upper end by a pin providing mechanical fixing and electric interconnection of the sliding test contact with the test clip.

21. The test clip as claimed in claim 1, wherein each lever has an upper arm which forms an angle of about 150° with a lower arm thereof.

22. The test clip as claimed in claim 1, wherein with said integrated circuit brazed directly to a carrier board, said test clip comprises additional hooks disposed in an extesion of lower arms of the levers which snap into four holes pierced in the carrier board at four corners of the integrated circuit.

23. The test clip as claimed in claim 22, wherein said additional hooks are provided with a snap fit slope for facilitating insertion thereof into the holes of the carrier board and wherein the edge of the hooks is in the extension of the edge of the lower arm coming to bear on a stop face of the insulating body.

24. The test clip as claimed in claim 1, wherein, said integrated circuit is formed by a chip carrier having two rows of alternating studs on four sides and two faces thereof, said test clip comprises at its periphery said test clip contacts as "pump" test contacts in two alternating rows.

25. The test clip as claimed in claim 24, wherein lower arms of the levers having small hooks are constructed for allowing snap fitting thereof into holes of the chip carrier.

* * * * *